United States Patent
Yamaoka

(10) Patent No.: US 6,619,531 B1
(45) Date of Patent: Sep. 16, 2003

(54) TEMPERATURE CONTROL METHOD OF SOLDER BUMPS IN REFLOW FURNACE, AND REFLOW FURNACE

(75) Inventor: Nobuyoshi Yamaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/506,339

(22) Filed: Feb. 18, 2000

Related U.S. Application Data

(62) Division of application No. 09/040,369, filed on Mar. 18, 1998, now Pat. No. 6,206,265.

(30) Foreign Application Priority Data

Oct. 20, 1997 (JP) ............................................. 9-287462

(51) Int. Cl.⁷ ........................ B23K 37/00; B23K 31/02; F27F 9/02
(52) U.S. Cl. .......................... 228/9; 228/102; 432/128
(58) Field of Search .............................. 228/102, 233.2, 228/103, 234.1, 8, 9, 10; 126/99 R, 117, 106, 108; 432/120, 121, 122, 128, 129

(56) References Cited

U.S. PATENT DOCUMENTS

| | | | | |
|---|---|---|---|---|
| 4,771,929 A | | 9/1988 | Bahr et al. ................... | 228/102 |
| 4,775,776 A | | 10/1988 | Rahn et al. .................. | 219/388 |
| 5,003,160 A | | 3/1991 | Matsuo et al. ............... | 219/494 |
| 5,232,145 A | * | 8/1993 | Alley et al. | |
| 5,260,548 A | | 11/1993 | Todd et al. .................. | 219/483 |
| 5,370,531 A | * | 12/1994 | Tsurumi et al. | |
| 5,413,164 A | | 5/1995 | Teshima et al. ............. | 165/1.1 |
| 5,439,160 A | | 8/1995 | Marcantonio ................ | 228/102 |
| 5,443,382 A | * | 8/1995 | Tsurumi et al. | |
| 5,515,605 A | | 5/1996 | Hartmann et al. ............ | 29/840 |
| 5,560,533 A | | 10/1996 | Maenishi ........................ | 228/8 |
| 5,562,243 A | * | 10/1996 | Marcantonio | |
| 5,579,981 A | * | 12/1996 | Matsumura et al. | |
| 5,647,529 A | | 7/1997 | Liebman et al. ............. | 228/222 |
| 5,797,539 A | * | 8/1998 | Wilde et al. | |
| 5,971,249 A | * | 10/1999 | Berkin | |
| 6,005,224 A | * | 12/1999 | Wesseling et al. | |
| 6,106,281 A | * | 8/2000 | Materna | |
| 6,135,344 A | * | 10/2000 | Sakuyama et al. | |
| 6,206,265 B1 | * | 3/2001 | Yamaoka | |
| 6,231,229 B1 | * | 5/2001 | Halderman | |
| 6,347,757 B1 | * | 2/2002 | Takahashi et al. | |

FOREIGN PATENT DOCUMENTS

| | | |
|---|---|---|
| JP | 1-170577 | 7/1989 |
| JP | 1-185993 | 7/1989 |
| JP | 4-83471 | 7/1992 |
| JP | 9-219582 | 8/1997 |

\* cited by examiner

*Primary Examiner*—M. Alexandra Elve
*Assistant Examiner*—Kiley Shawn Stoner
(74) *Attorney, Agent, or Firm*—Armstrong, Westerman & Hattori, LLP

(57) ABSTRACT

A method for determining the condition of a reflow furnace so as to prevent the semiconductor element from tilting due to different collapsed amounts of solder bumps in the single semiconductor element of multiple chip modules mounted on the semiconductor element on the substrate. For the carrying direction in the reflow furnace using a carrying belt, temperature analysis for time duration is performed for the solder bumps at both the front and rear, and then the condition of the reflow furnace is determined so as to close at both the times for reaching the solder melting temperature and the times for maintaining the solder melting temperature.

1 Claim, 11 Drawing Sheets

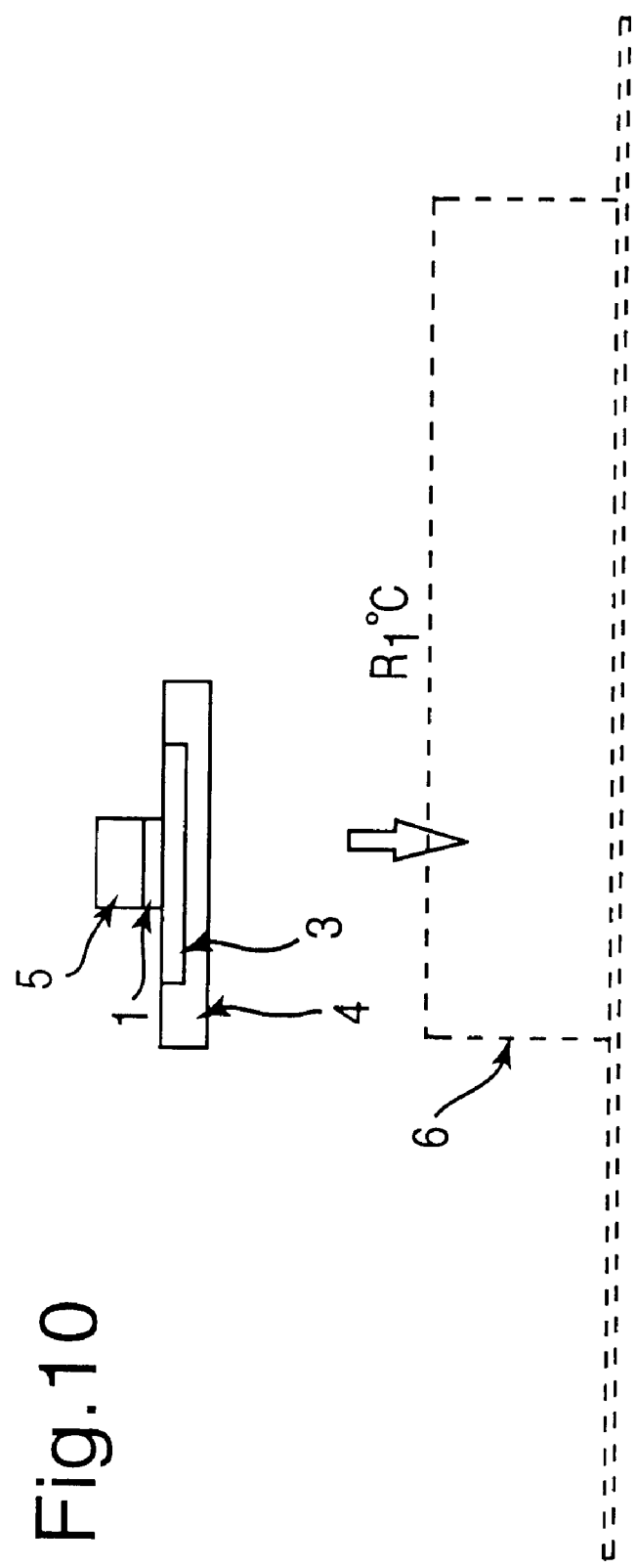

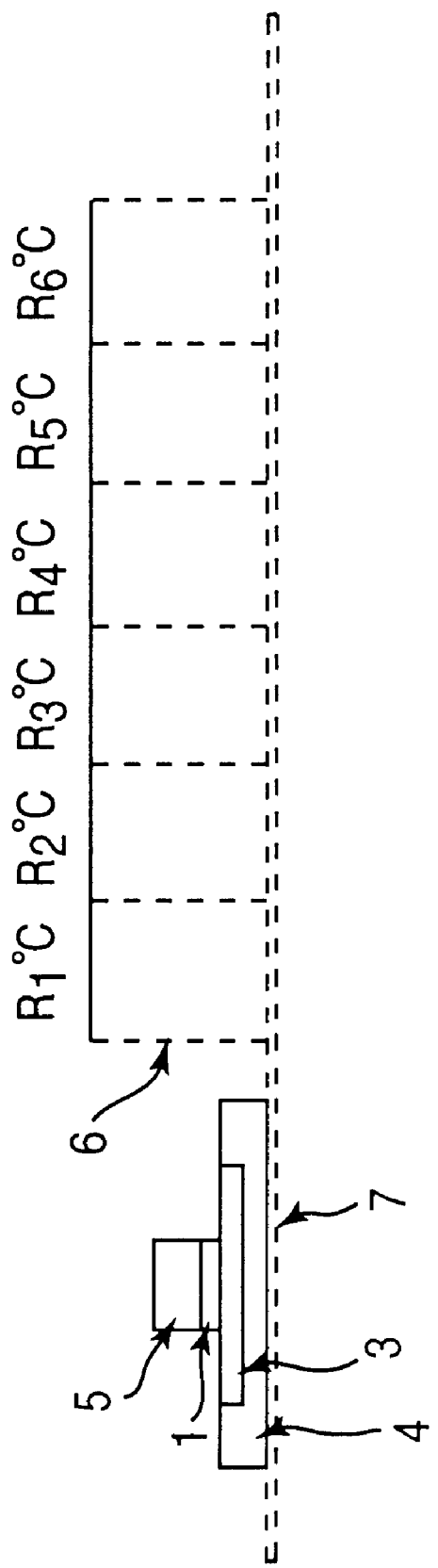

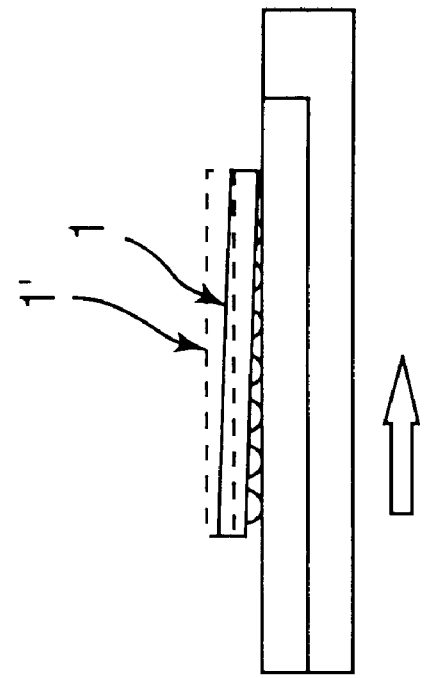
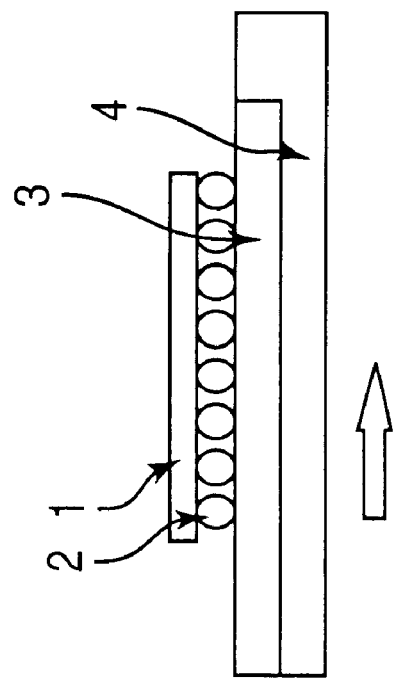
Fig.12(a) PRIOR ART
Fig.12(b) PRIOR ART
MCM ADVANCING DIRECTION

TEMPERATURE CONTROL METHOD OF SOLDER BUMPS IN REFLOW FURNACE, AND REFLOW FURNACE

This application is a divisional of prior application Ser. No. 09/040,369 filed Mar. 18, 1998 now U.S. Pat. No. 6,206,265.

BACKGROUND OF THE INVENTION

1. Field of the Invention

The invention relates to a method of determining the conditions of a reflow furnace in which a semiconductor element is mounted on a substrate and, more particularly, to a method of preventing the displacing of melting of solder bumps.

2. Description of the Related Art

FIG. 11 shows an outline of the reflow furnace for heating solder so as to mount the semiconductor element on the substrate. Terminals of packaging parts referred to as BGA or CSP, or of the semiconductor element 1 comprising bare chips are, as shown, formed with solder bumps 2, as shown in FIG. 12(a), and positioned and mounted onto a substrate 3 The substrate 3 is placed in a mounting jig 4 made by carbon and conveyed onto a conveyor belt. For securing connection with the solder bumps 2, the semiconductor element 1 is loaded with a weight 5 of several milligrams for each bump 2 to be mashed when the solder bumps 2 are melted. Thus, the substrate 3 and the semiconductor element 1 are moved by the conveyor belt into the reflow furnace 6, and heated by a heat of a gas within the reflow furnace 6. The heat thereby is transferred to the solder bumps 2, the solder bumps 2 are melted, and the semiconductor element 1 and the substrate 3 are connected. The temperature in the reflow furnace 6 is set to different temperatures in , e.g., six zones, as shown in the figure. The temperature is set to rise from the entrance side of the reflow furnace toward the inside, and is then set to drop at the exit portion. The zone at the entrance side, called the "preheating zone", is constructed such that even if mounting parts are different, a solder for mounting a plurality of mounting parts having the semiconductor element 1 in a lump has a uniform temperature. The following zone is called the "reflow zone", and is set at a temperature at which the solder can be melted. Assuming that these six zones are R1, R2, R3, R4, R5, and R6, respectively, the temperature relationship thereof is set as R1<R6<R2<R3=R5<R4. If the solder bumps have high concentration of Pb, since the melting point is around 310° C., R1 is set around 300° C., which is a temperature just under the melting temperature, R2 is set around 400° C., and R6 is set around 350° C., which is a temperature after the melting.

Although the temperature is thus set such that the solder is melted appropriately, there are some cases of which shortage phenomena occur at the connecting portion of the solder bumps. Taking statistics of such phenomena for each of the solder bumps of one semiconductor element, it is found that more shortages occurred around the solder bumps at the forward side of the advancing direction within a reflow furnace. That is, as shown in FIGS. 12(a)–12(b), a semiconductor element 1 mounted via solder bumps 2 on a substrate 3 housed in a mounting jig 4 is moved to the right as shown in FIG. 12(a). Then, as shown in FIG. 12(b), the semiconductor element 1 is mounted at a position lower than a regular mounting position 1. Further, at this time the mashed amount of the solder bumps is greater at the right side of the figure, which is the forward side of the advancing direction.

To analyze the phenomena in greater detail, the temperature history of the interior of the furnace was acquired and the temperature was analyzed using ABAQUS (product name), which is a general purpose analysis program of a finite element method of Hibbitt, Karlsson & Sorensen Inc., US. It was found that when the analysis was carried out, the temperature histories were different, in terms of time, between the solder bumps in the forward side and the solder bumps in the backward side of the advancing direction in the reflow furnace among the solder bumps to be provided on the same semiconductor element 1.

It is assumed that when the solder bumps reach the melting temperature, the mashed amount of the solder bump increases, and the sinking amount of the semiconductor element becomes larger as time progresses. If this condition occurs excessively, it is assumed that the solder bumps spread laterally, the adjacent solder bumps are fused together, and then the shorting phenomena occur.

The invention is directed toward removing the failure of connections caused by which the meshed amounts of the plurality, of solder bumps for connecting the semiconductor element to the substrate are different within a single semiconductor element.

SUMMARY OF THE INVENTION

The present invention is directed toward enabling optimal temperature control by analyzing, when setting the conditions of the reflow furnace, both of the temperature histories of the front and back solder bumps of the advancing direction in the reflow furnace among the solder bumps of a single semiconductor element to be mounted.

The first embodiment of the method of the invention is a method of mounting a semiconductor element in which the semiconductor element is mounted on a substrate via solder bumps, in which a mounting of the semiconductor element is carried out while moving the substrate into a reflow furnace, and in which the heat conductivity profile of the reflow furnace is set through temperature analysis. Temperature analysis is carried out to obtain temperatures in a forward side and in a rearward side of said movement of the solder bumps securing said semiconductor element. The temperature analysis step analyzes and alters the temperature gradient from the circumference of said semiconductor element to the center of the semiconductor element. From the analyzed results, the thermal conductive coefficient which is either the difference between the times of which the temperatures of the solder bumps at the forward and rearward sides exceeds the melting temperature of the solder is small, or the difference between the times of which the temperature of the solder bumps at the forward and rearward sides reaches the melting temperature of the solder is small, is obtained, and the temperature of the solder bumps is controlled by setting the heat conductivity profile within the reflow furnace based on the obtained thermal conductive coefficient.

A heat conductivity profile in the reflow furnace, with a convection mechanism which causes convection in a gas within the reflow furnace, is set by controlling the flow rate of the convection.

The heat conductivity in the reflow furnace is set high at a preheating area which is an area ahead of which the solder bumps are melted, and is set lower than that of the preheating area at a reflow area which is an area in which the solder bumps are melted.

A second embodiment of the method of the present invention is directed to the mounting of a semiconductor element, in which the semiconductor element is mounted on a substrate via solder bumps, in which a mounting of the semiconductor element is carried out while moving the substrate into a reflow furnace, and in which a jig is selected through temperature analysis, temperature control method of a solder bump in the reflow furnace, characterized by providing a step of the temperature analysis for obtaining, by temperature analysis, temperatures in a forward side and a rearward side of the moving of the solder bump securing the semiconductor element. The temperature analysis step analyzes and alters the shape and data of characteristic value of the jig, and obtains, from the analyzed results, a jig which is either the difference between the times of which the temperatures of the solder bumps at the forward and backward sides exceeds the melting temperature of the solder is small, or the difference between the times of which the temperature of the solder bumps at the forward and backward sides reaches the melting temperature of the solder is small, and controls, using the obtained jig, temperature of the solder bump in the reflow furnace.

The jig is a weight to be mounted on the semiconductor element, and a time difference is reduced by altering the heat capacity of the weight.

The jig is a weight to be mounted on the semiconductor element, and the weight is fin shaped to alter the surface area of the weight and to allow the change of the temperature gradient, and that the difference in time is reduced by altering the weight.

The jig is a receipt jig which houses the substrate, and the difference in time is reduced by altering the heat capacity of the receipt jig.

The jig comprises a receipt jig housing the substrate, and a cover which covers the substrate, and the cover has an opening at the part for the weight to be mounted on the semiconductor element.

By this method, at the forward and rearward sides of the solder bumps connecting the substrate and the semiconductor element which move within the reflow furnace, the difference between times of which the solder bumps reaches the melting temperature is reduced, the mashed amounts of the plural solder bumps within the-single element may be made almost equal. A reflow furnace for mounting a semiconductor element while the semiconductor element is mounted on a substrate via solder bumps, and while moving the substrate into a reflow furnace, is characterized in that the reflow furnace of the present invention is set different temperatures in multiple areas, and is provided with convection mechanisms for causing a different convection for each area.

By the above structure, at the solder bumps in the front and back of the semiconductor element secured by the reflow furnace, controlling width of reducing the difference between times of which the solder bumps reaches the melting temperature, is broadened and the productivity of the substrate is enhanced.

BRIEF DESCRIPTION OF THE DRAWINGS

FIG. 10 is a drawing showing a method for inserting a circuit module cover into reflow furnace;

FIG. 11 is a drawing showing a reflow furnace of the prior art; and

FIGS. 12 ($a$) and 12 ($b$) are drawings explaining problems of the prior art.

DETAILED DESCRIPTION OF THE PREFERRED EMBODIMENTS

Figure 1:
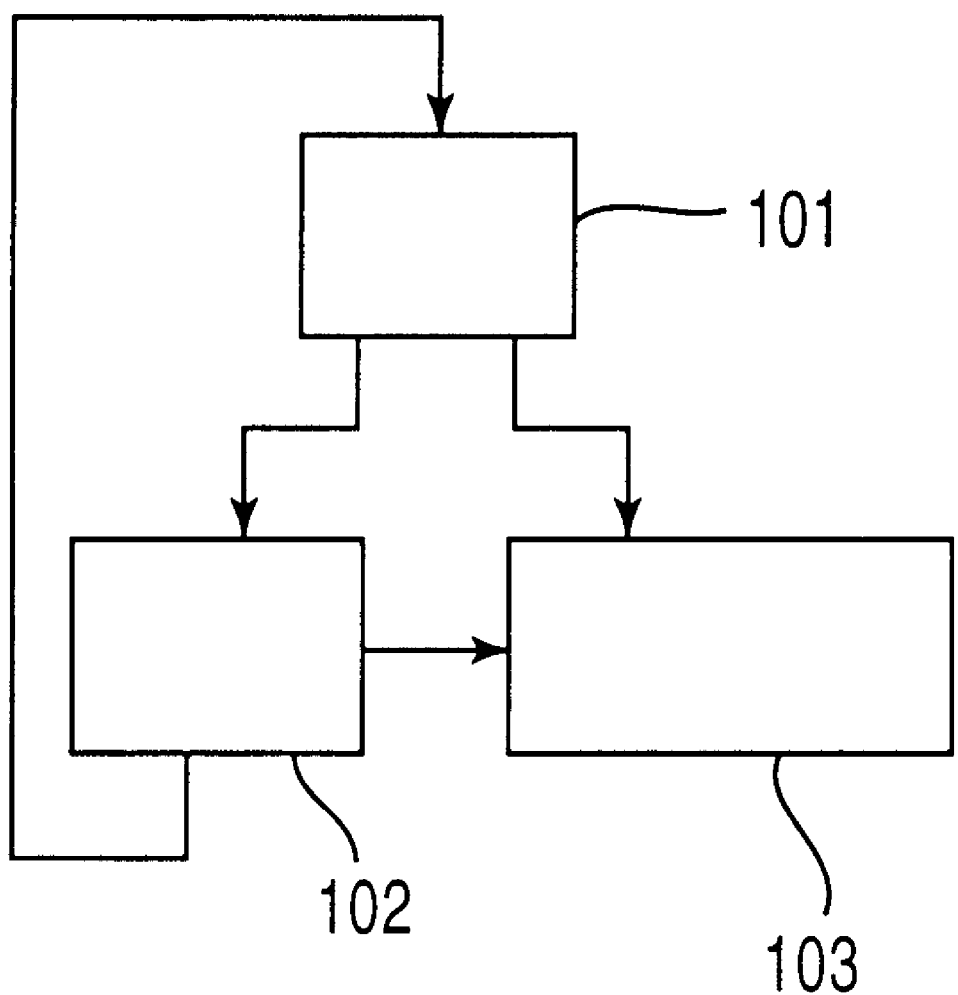
FIG. 1 is a flow chart showing the principle steps of the present invention.

FIG. 1 shows a method of controlling the temperature of the solder bumps. In step 101, by temperature analysis, the temperatures at the forward and rearward directions of movement of the solder bumps securing the semiconductor element are obtained. In step 102, the setting conditions are changed, and at step 101 again the temperature analysis is again carried out. Several temperature analyses are repeated, and after that at step 103 the conditions of the reflow furnace are changed. From the analyzed results obtained through step 101, the one which is either the difference between the times of which the temperatures of the solder bumps at the forward and rearward sides exceeds the melting temperature of the solder is small, or the difference between the times of which the temperature of the solder bumps at the forward and rearward sides reaches the melting temperature of the solder is small, is selected, and sets the conditions of the reflow furnace based on the altered conditions at the step 102.

Figure 2:
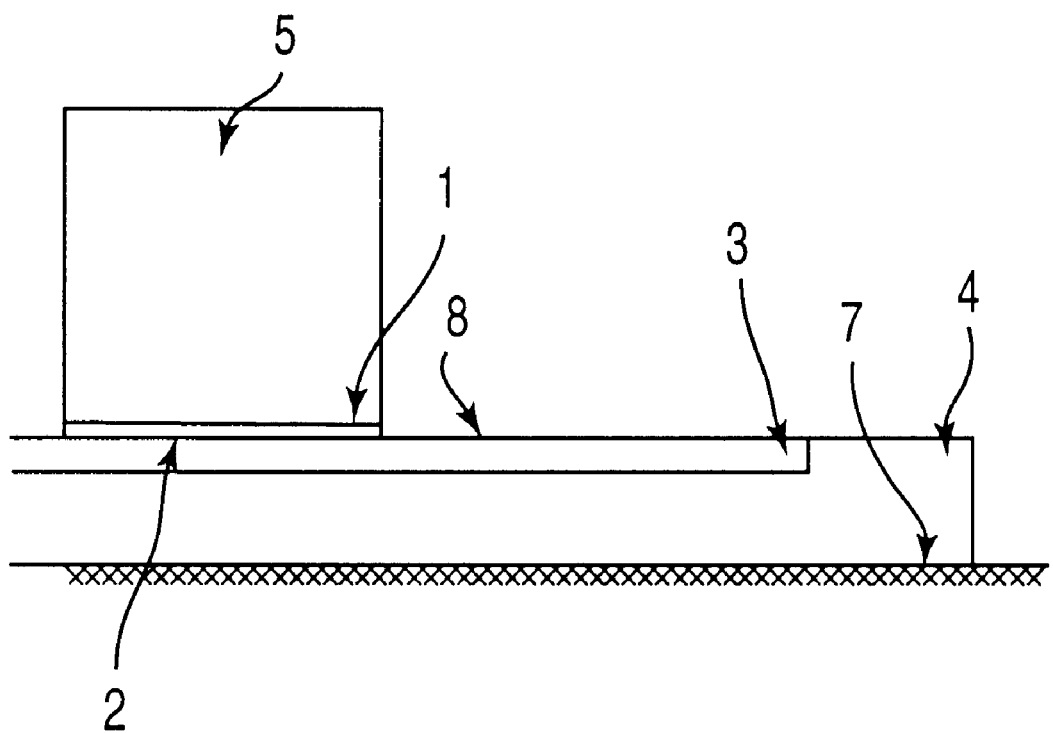
FIG. 2 is a drawing of a circuit module of the present invention.

FIG. 2 shows a circuit module composed of the semiconductor element and the substrate used in the analysis for applying the inventive method, and the jig. Table 1 shows values of physical properties.

TABLE 1

| | Values of Physical Properties | | |
|---|---|---|---|
| Objects | Heat conductive coefficient: W/m.K | Specific heat: J/kg.K | Density: kg/m$^3$ |
| Chip Si | 148.0 | 713.0 | 2330.0 |
| Bump High Pb Solder | 35.6 | 200.0 | 8990.0 |
| Thin Film | 0.117 | 1090.0 | 1420.0 |

The semiconductor element 1 is a bare chip which is mounted on the substrate 3 through the solder bumps 2. The substrate 3 is received within the receipt jig 4, and the weight 5 is placed on the semiconductor element 1. On the surface of the substrate 3, a thin-film circuit is formed from polyimide film. As seen from Table 1, the semiconductor element 1 is formed from silicon, the solder bump 2 is formed with high Pb content solder, and the substrate is formed with aluminum nitride, and the major part of the polyimide film 8 is formed from polyimide, and the mounting jig 4 is formed from carbon, and the weight is formed from SUS-405 stainless steel.

Such a structure, physical properties, and conditions in the furnace may be known, the temperature analysis can be carried out with a general purpose analyzing program based on the finite element method (for example, "ABAQUS" of Hibbitt, Karlsson & Sorensen Inc. US). This program is input with the shaping data as shown in FIG. 2, the physical properties of the materials of the Table 1, the temperature in the furnace being the circumferential temperature, and the heat conductivity. The heat conductivity of the boundary between fluid and solid is obtained from formula 1 below:

$$q=h(Ta-Tm) \quad (1)$$

Where h is the heat conductivity, q is heat flow rate which is quantity of heat passing a unit area, Ta is the surface temperature of the solid, and Tm is the average temperature of the fluid.

That is, the heat conductivity h can be obtained by obtaining q, Ta and Tm. An amount of outgoing radiation is obtained by measuring the temperature of the solid, for example, at the surface of the weight, in a state which calorific value is known by which a known voltage is applied to the semiconductor element, and by which a known current is supplied, and the heat flow velocity q is obtained by dividing the amount of outgoing radiation by the surface area. Ta may be obtained by measuring the temperature of the surface of weight, and Tm may be obtained by measuring the temperature at a point away from the weight in 1 cm or more. Since the error is significant with such measurement, reference is made to "Reidai Enshu Dennetsu Kogaku" by Saitoh, Okada and Ichinomiya, issued by Sangyo Tosho Shuppan, and the thermal conductivity is determined in accordance with circumstances and shapes.

After various kinds of data are determined as explained above, temperature histories of the solder bumps for both the forward and rearward sides of the semiconductor element are acquired.

Figure 3:
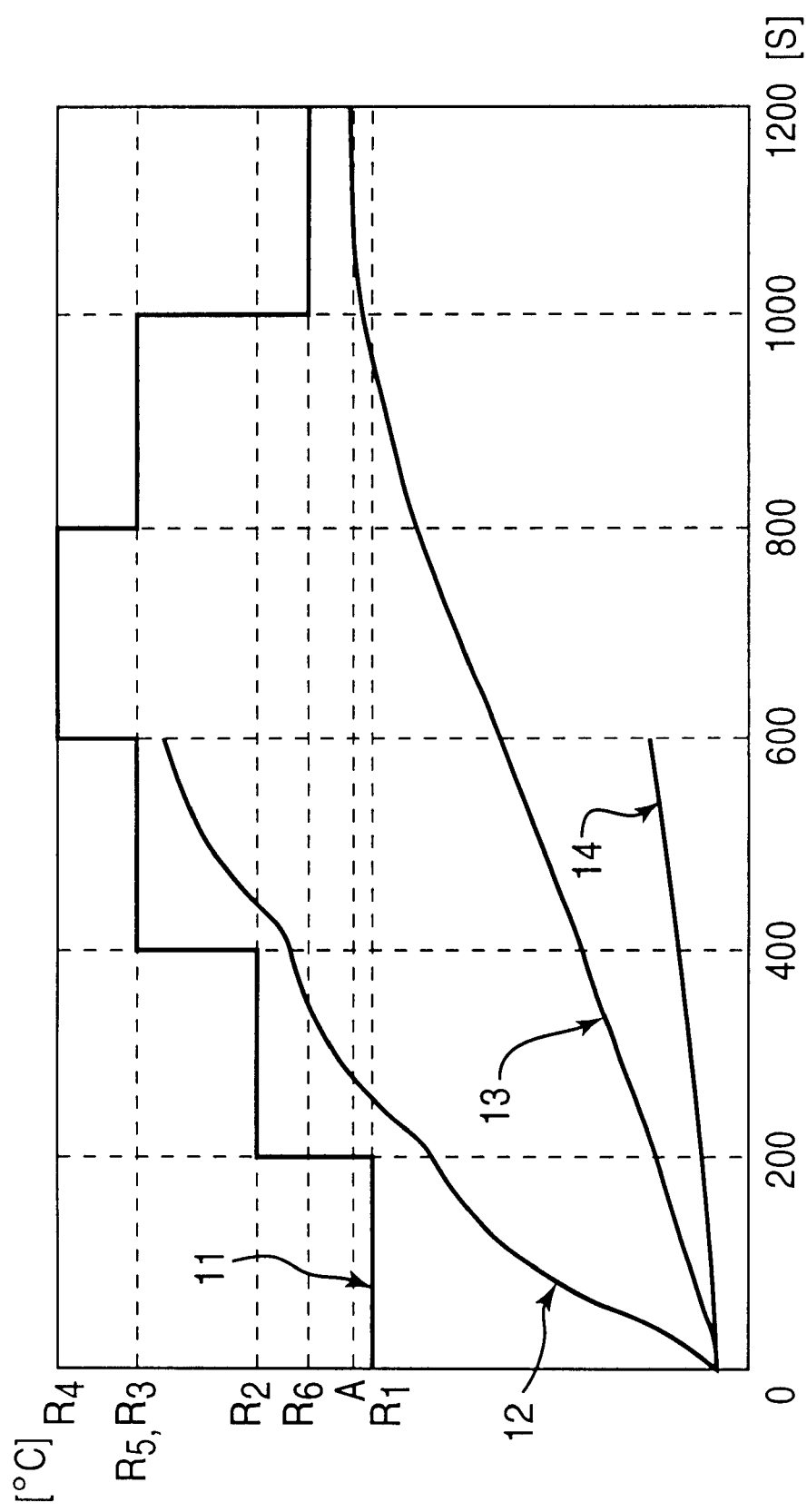
FIG. 3 is a graph showing analyzed results of the invention.

FIG. 3 shows the results of the temperature analyses in accordance with the structure and the values of physical properties as shown in FIG. 2 and the Table 1. Table 2 shows, among the analyzed results, the times at which the forward and rearward solder bumps reach the melting temperature. The lateral axis of FIG. 3 represents the time in which the starting point is at which the circuit module is placed in the furnace, and the vertical axis represents temperature. Number 11 designates a theoretically set temperature. Assuming that the temperatures in the zones of the reflow furnace are R1, R2, R3, R4, R5 and R6, the temperature relationship is determined as R1<R6<R2<R3= R5<R4. If the solder bump is high content Pb solder, since the melting temperature is around 310° C., R1 may be set around 300° C. immediately below the melting temperature, R2 is set at around 400° C., and R6 is set at around 350° C., being a temperature after melting. Numbers 12 to 14 are analyses where the heat capacity of the mounting jig is 1.566×106 J/m³·K, the heat capacity of the weight is 3.588× 106 J/m³·K, and the heat conductivity is constant in the reflow furnace. Number 12 shows analyzed temperatures of the solder bump when the heat conductivity is set at 200 W/m²·K. Number 13 shows analyzed temperatures of the solder bumps when the heat conductivity is set to 20 W/m²·K. Number 14 shows analyzed temperatures of the solder bumps when the heat conductivity is set at 5 W/m²·K. By analyzing over time the temperatures of the solder bumps, it is possible to obtain the time which is required to reach the melting temperature A° C. of the solder bumps and the time of which the solder bump is over the melting temperature A° C. Such analyses were made for the forward and backward solder bumps, and the compared results are shown in Table 2.

TABLE 2

| Heat conductive coefficient in the furnance: W/m² · K | Time for completion of melting of bump (Reaching A ° C.) | | Time Lag: sec |
|---|---|---|---|
| | Forward of Bump: sec | Backward of Bump: sec | |
| 5 | 1200 or more | 1200 or more | — |
| 20 | 1097.60 | 1098.81 | 1.21 |
| 200 | 276.05 | 277.41 | 1.36 |

As shown in Table 2, time lags can be obtained from time which is required to reach the melting temperature A° C. of the solder. As can be understood from the Table 2, where the heat conductivity is made constant and set at 20 W/m²·K, the time when the solder bump starts melting is shortened, and the difference in the crushing amounts of the solder bumps is minimal.

Figure 4:
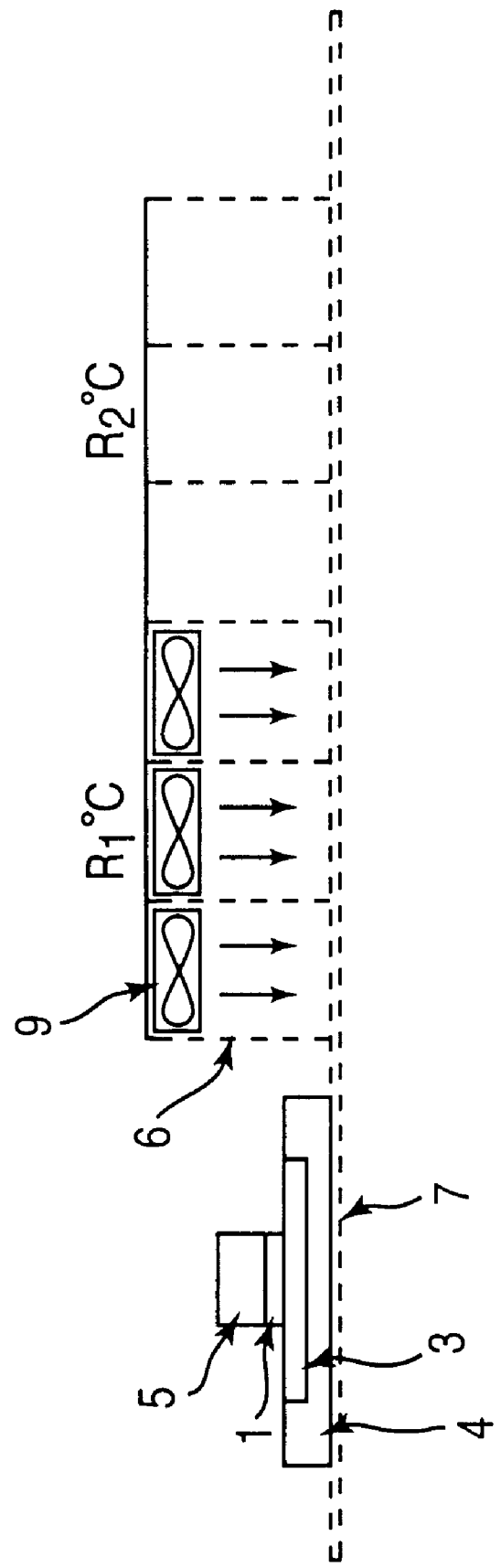
FIG. 4 is a drawing showing a reflow furnace in which the thermal conductive coefficient is varied.
Figure 5:
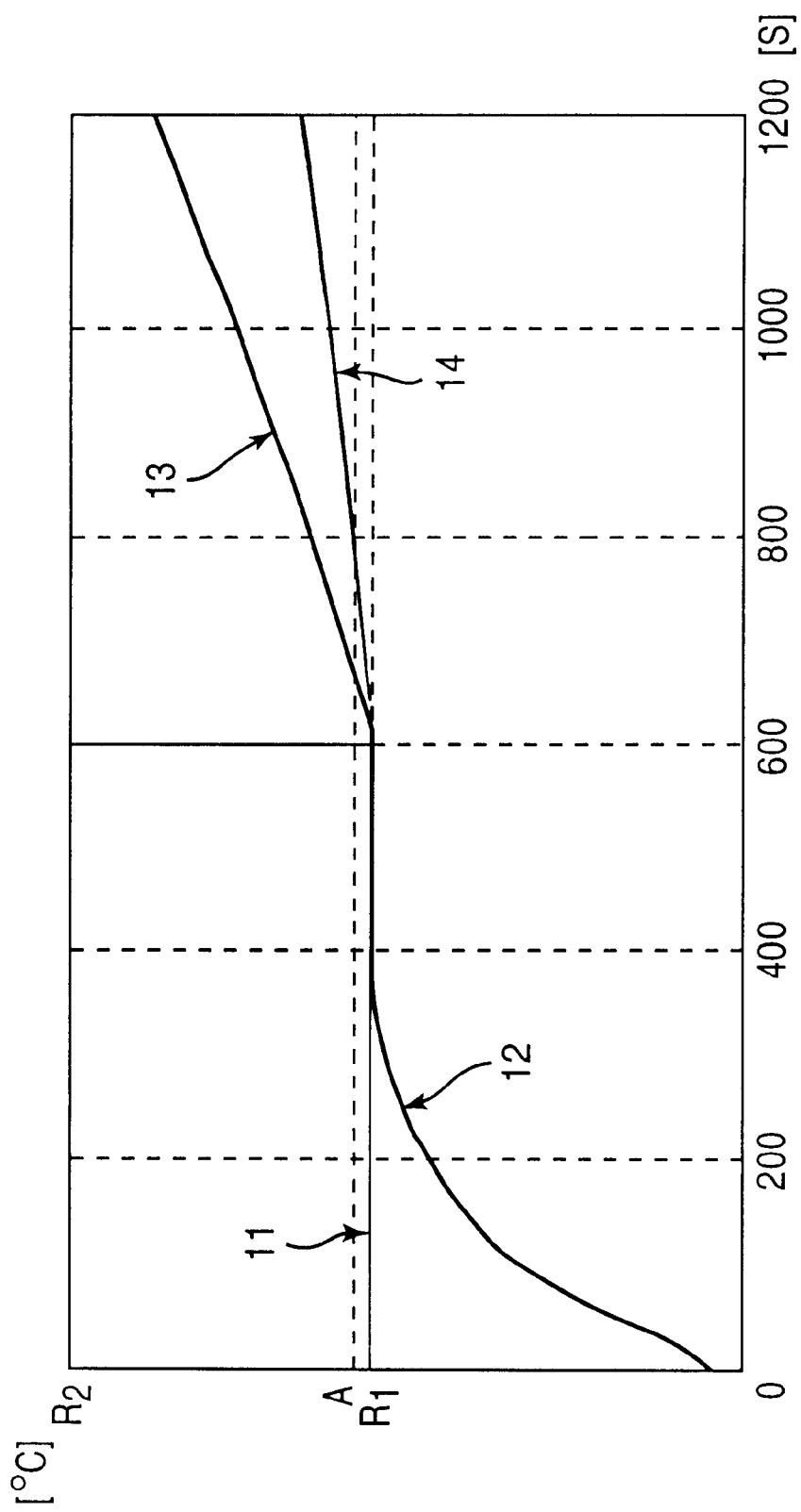
FIG. 5 is a graph showing analyzed results of the reflow furnace described in FIG. 4.

FIG. 4 shows changes in thermal conductivity for the zones of the reflow furnace, and FIG. 5 shows the results of analyzing the temperatures at that time. As shown in FIG. 4, assuming that the temperature in the first half of the zones of the reflow furnace is RI, and the temperature in the latter half of the zones is R2, R1 may be set at around 300° C. immediately below the melting temperature, and R2 may be set at around 350° C. after melting. The heat capacity of the mounting jig and the weight is the same as that in the analyzing time shown in FIG. 3. However, in the R1° C. area, a convection mechanism 9 is provided so that the thermal conductive coefficient becomes high. The convection mechanism 9, for example, is configured by a duct so that air of R1° C. can blow against the circuit module as in the reflow furnace. Also, it is desirable that the convection mechanism 9 is configured to control the amount of flow, and it is desirable to control the amount of air flow until the heat conductivity reaches the predetermined coefficient at the time of analysis. As described, by heating the circuit module such that the temperature reaches a temperature immediately below the melting temperature as soon as possible, there is no difference in temperature throughout the entire circuit module. Heating is carried out at the area of R2° C. in the state where there is no difference in the temperature spread, thus, the temperature difference between the front and rear of the area is reduced, and the time lag for reaching melting temperatures at the front and back of the solder bump is in turn reduced. The results, of analysis executed during this state are shown in FIG. 5. Number 11 shows a theoretical temperature in the reflow furnace. Number 12 represents the analyzed temperature of the solder bumps for setting, by the convection mechanism 9, the thermal conductive coefficient to 200 W/m²·K. Number 13 represents the analyzed temperature of the solder bumps for setting the thermal conductive coefficient to 20 W/m²·K. Number 14 represents the analyzed temperature of the solder bumps for setting the thermal conductive coefficient to 5 W/m²·K. Here, the analyses are made using the different analysis coefficient between numbers 13 and 14, however, even with the different thermal conductive coefficients input into the reflow furnace, the amount of air in, the convection mechanism is controlled and the thermal conductive coefficient for both 13 and 14 can be raised to 200 W/m²·K. As shown in number 12, the temperature of the solder bump becomes constant at between 400 and 600 seconds, and thus, the temperature difference between the solder bump at the front and rear can be equalized during this time duration.

Figure 6:
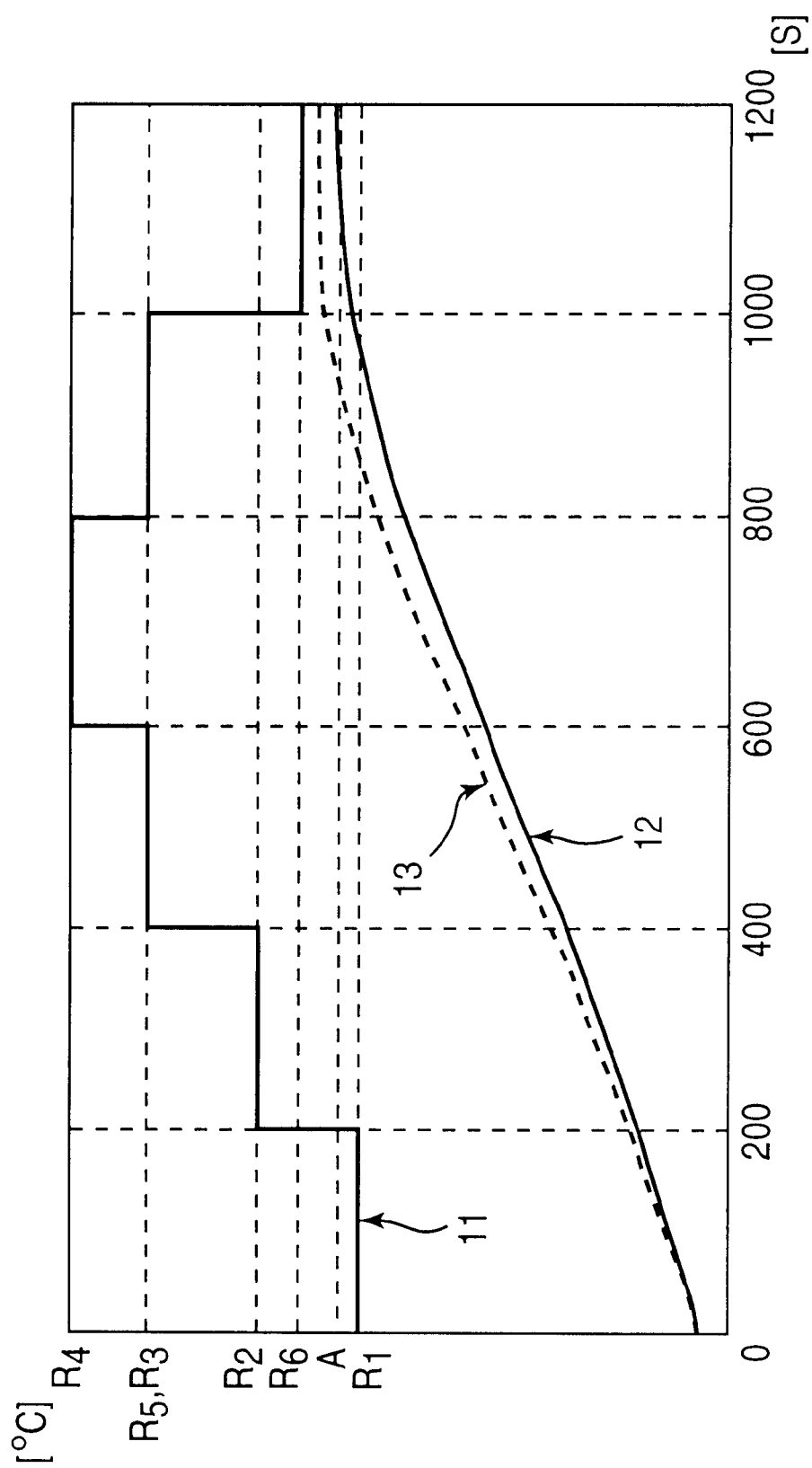
FIG. 6 is a graph showing additional analyzed results of the present invention.

FIG. 6 represents, among the analyzed results, other analyzed results in which the smallest difference in the time lags for the thermal conductive coefficient reaching the melting temperature between the front and rear of the solder bumps is set to 20 W/m²·K. Number 11 represents the theoretical setting temperature. Number 12 represents the analyzed temperature of the solder bumps when the heat capacity of the mounting jig is set to 1.566×106 J/m³·K. Number 13 represents the analyzed temperature of the solder bumps when the heat capacity of the mounting jig is set to 0.783×106 J/m³·K. Other elements are the same as in FIG. 3. Table 3 shows the comparison results for both the front and rear of the solder bumps in this analysis.

TABLE 3

| Heat conductive coefficient | | | Time for completion of melting of bump (Reaching A ° C.) | | |
| --- | --- | --- | --- | --- | --- |
| in the furnace: | Heat capacity: 106J/m³K | | Forward of Bump: | Backward of Bump: | Time Lag: |
| W/m²K | Jig | Weight | sec | sec | sec |
| 20 | 1.566 | 3.588 | 1097.60 | 1098.81 | 1.21 |
| 20 | 0.783 | 3.588 | 916.14 | 917.85 | 1.71 |

As shown in Table 3, time lags can be calculated from the time that both the front and rear of the solder bump reaches the melting temperature A° C. As can be seen in Table 3, the start time of the melting of the solder bumps can be reduced by varying the heating amount of the mounting jig, and thus the difference between the crushed amounts of solder bumps can be reduced.

Figure 7:
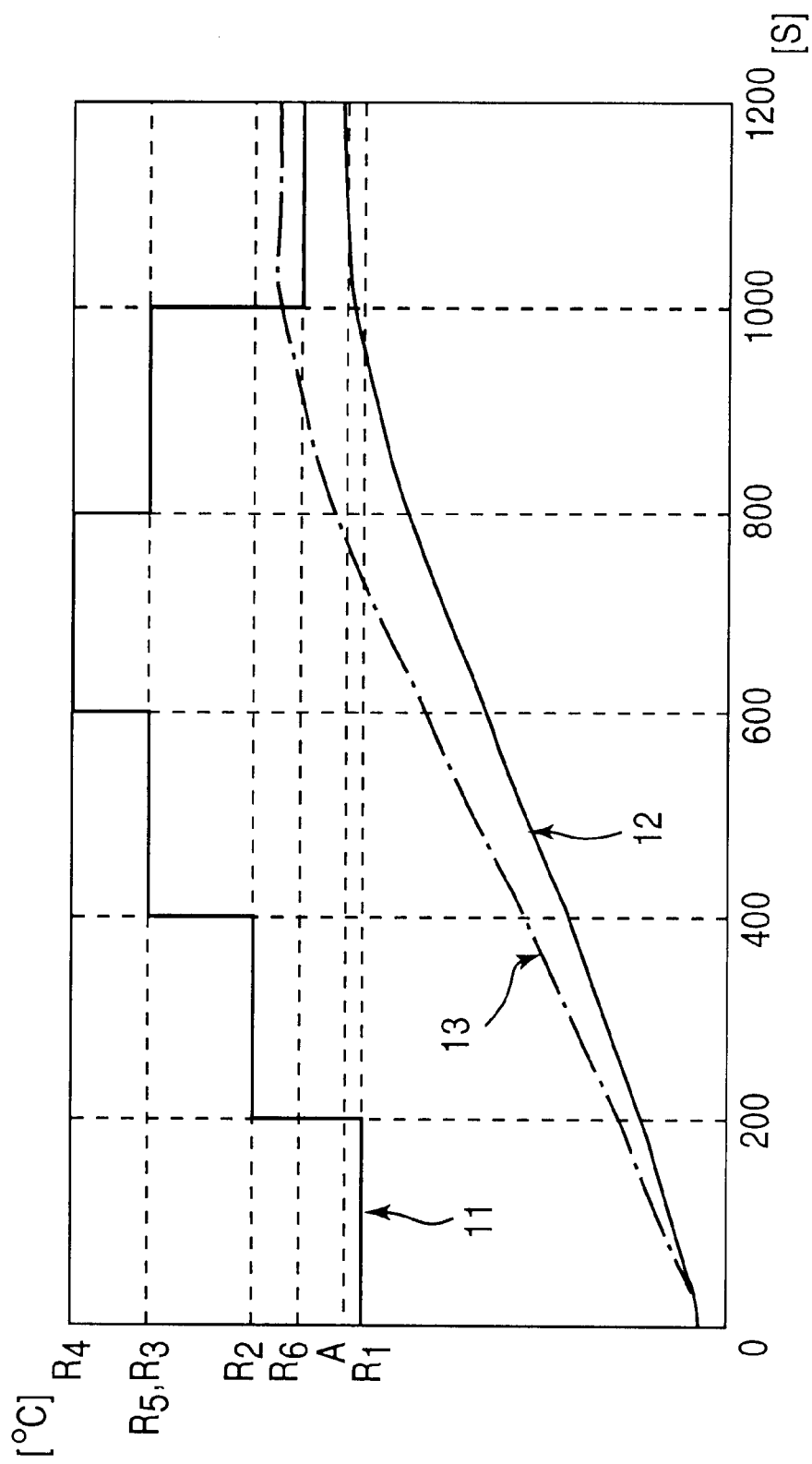
FIG. 7 is a graph showing additional analyzed results of the present invention.

FIG. 7 represents, among the analyzed results, another analysis result in which the heat capacity of the mounting jig with the least time lag in reaching the melting temperature both in the front and back of the solder bumps has been set to 1.566×106 J/m³·K. As is the case with FIG. 6, number 11 represents the theoretically set temperature. Number 12 represents the analyzed temperature of the solder bumps when the heat capacity of the weight of the receipt jig is set to 3.588×106 J/m³·K. Number 13 represents the analyzed temperature of the solder bumps when the heat capacity of the weight is set to 1.794×106 J/m³·K. Other elements are the same as in FIG. 6. Table 4 shows the comparison results after analysis for both the front and back of the solder bumps.

TABLE 4

| Heat conductive coefficient | | | Time for completion of melting of bump (Reaching A ° C.) | | |
| --- | --- | --- | --- | --- | --- |
| in the furnace: | Heat capacity: 106J/m³K | | Forward of Bump: | Backward of Bump: | Time Lag: |
| W/m²K | Jig | Weight | sec | sec | sec |
| 20 | 1.566 | 3.588 | 1097.60 | 1098.81 | 1.21 |
| 20 | 1.566 | 1.794 | 766.64 | 767.12 | 0.48 |

As shown in Table 4, the time lags can be obtained from the time when both the front and back solder bumps reach the melting temperature A° C. As can be seen in Table 4, start time solder bump melting can be reduced by varying the heating capacity of the mounting jig, and thus the difference in the crushed amount of the solder bumps can be reduced.

By repeating the analyses as given above, setting the heat conductive coefficient to 20 W/m²·K, the heat capacity of the mounting jig to 1.566×102 J/m³·K, and the heat capacity to 1.79×106 J/m³·K, the shortest time lags for starting the melting of the solder bumps can be obtained, and the difference in the crush amount of the solder bumps can be reduced.

Figure 8:
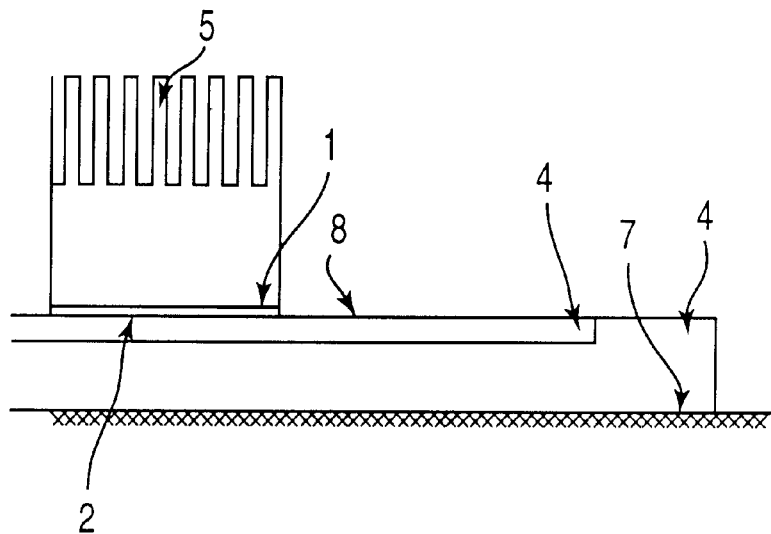
FIG. 8 is a drawing showing structure in which the thermal conductive coefficient is changed.

FIG. 8 shows the structure for changing the heat conductive coefficients. There is a case where it is necessary to raise the heat conductivity entirely in the reflow furnace through the above analysis, for example, where there are plural semiconductor elements and the thermal conductive coefficient in only the specific semiconductors are to be raised. In this case, the upper section of weight 5 to be mounted on the semiconductor element 1 is processed into a fin shape, and then the thermal conductive coefficient can be raised. By which the upper section of weight 5 is formed as a fin shape, increasing the surface area of the weight and increasing the contact surface area within the air in the reflow furnace, and therefore, the thermal conductive coefficient can be increased.

Figure 9:
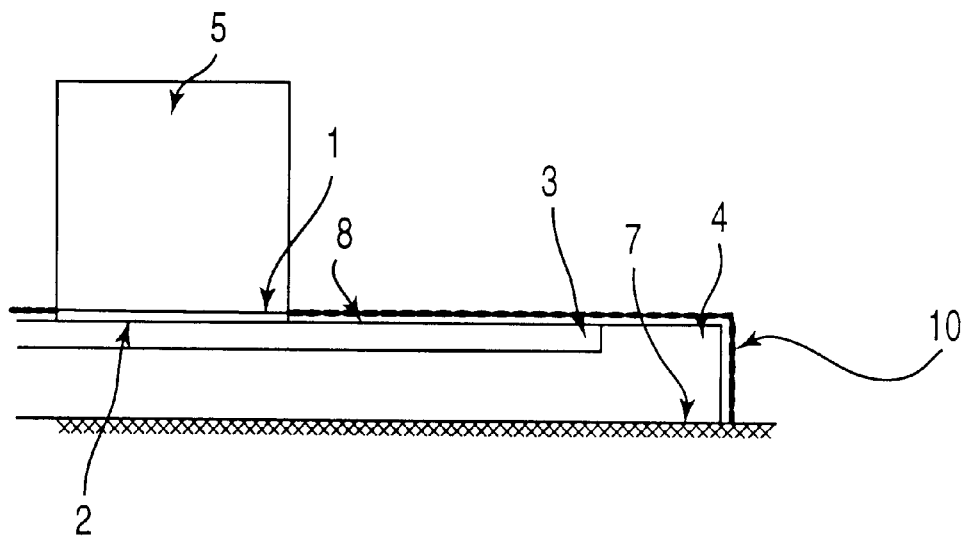
FIG. 9 is a drawing showing a circuit module cover.

FIG. 9 shows a configuration in which different time lags by position in the circuit module are reduced if time lags exist when the front-edge and rear-edge are entered in the reflow furnace, or the time lags exist when the front-edge and the rear-edge of the circuit module are replaced under a different temperature in the reflow furnace. Number 10 is a polyimide cover formed to cover the mounting jig 4. The cover 10 has an opening only at the section that corresponds to semiconductor 1, and the weight 5 is only exposed by laying the cover 10 at the state which the weight 5 is mounted on the circuit module. By this, heat is disconnected by inserting the large substrate 3 or mounting jig 4 which have time lags considerably between the front and end when they are placed in the furnace, and thus the time lags in the temperature rise of the circuit module become small.

FIG. 10 shows the method of reducing the temperature difference due to the time factor when substrate 3 enters the reflow furnace from the normal temperature which represents a large temperature difference, and it is structured that the entire substrate can be placed inside the furnace at the same time. By doing so, as in FIGS. 4 and 5, the temperature prior to reaching the solder bump's melting temperature becomes even, and thus the time required to reach the melting temperature of the solder bumps is reduced.

As described above, among multiple solder bumps provided at the semiconductor elements, the temperature histories at the inserting direction of both the front and back of the solder bumps are analyzed, and detailed setting conditions in the reflow furnace can be enabled to realize highly productive temperature settings.

What is claimed is:

1. A reflow furnace for mounting a semiconductor element while the semiconductor element is mounted on a substrate via solder bumps, and while moving the substrate into a reflow furnace, wherein the reflow furnace includes a plurality of convection mechanisms arranged within said furnace for providing different temperatures in different areas based on a heat conductivity profile of the furnace which is determined according to temperature analysis, wherein said reflow furnace has a high heat conductivity at a preheating area ahead of a reflow area in which the solder bumps are melted, and said reflow area has a lower heat conductivity than the heat conductivity of the preheating area, and wherein all of said plurality of convection mechanisms are arranged only in said preheating area.

* * * * *